United States Patent [19]
Arima

[11] 3,969,710
[45] July 13, 1976

[54] APPARATUS FOR PICKING UP SIGNAL CURRENTS FLOWING THROUGH SIGNAL LINES

[75] Inventor: Takeo Arima, Tokyo, Japan

[73] Assignee: Hochiki Corporation, Japan

[22] Filed: May 22, 1974

[21] Appl. No.: 472,451

[30] Foreign Application Priority Data
May 25, 1973  Japan........................ 48-60735[U]
May 23, 1973  Japan........................ 48-60980[U]

[52] U.S. Cl.................... 340/253 R; 317/18 D; 317/27 R; 317/33 SC
[51] Int. Cl.²........................................ G08B 21/00
[58] Field of Search........ 340/253 R, 253 H, 253 P, 340/248 P, 248 E, 253 A, 253 E, 195; 317/18 D, 27 A, 27 R, 18 B; 324/127, 51

[56] References Cited
UNITED STATES PATENTS

| | | | |
|---|---|---|---|
| 3,539,868 | 11/1970 | Stevenson | 317/27 |
| 3,579,280 | 5/1971 | Florance | 324/51 |
| 3,590,324 | 6/1971 | Rockefeller | 317/28 |
| 3,611,038 | 10/1971 | Benham | 317/18 D |
| 3,668,472 | 6/1972 | Shields et al. | 317/27 R |
| 3,737,726 | 5/1973 | Tarchalski | 317/27 R |
| 3,800,189 | 3/1974 | Montz | 317/18 D |
| 3,806,764 | 4/1974 | Hobson et al. | 317/27 R |
| 3,810,003 | 5/1974 | Portoulas | 324/51 |
| 3,813,579 | 5/1974 | Doyle et al. | 317/18 D |
| 3,859,567 | 1/1975 | Allard | 317/18 D |

Primary Examiner—John W. Caldwell
Assistant Examiner—James J. Groody
Attorney, Agent, or Firm—Haseltine, Lake & Waters

[57] ABSTRACT

In apparatus for picking up a pulse shaped signal current flowing through a signal line for operating a remotely located relay, a pickup coil is wound on a magnetic core linking the signal line and the voltage induced in the pickup coil is applied to a high resistance or a programmable unijunction transistor having a high input impedance. The output of the unijunction transistor is applied to the gate electrode of a thyristor while at the same time the discharge current of a capacitor is passed through the gate electrode of the thyristor via the unijunction transistor thereby assuring positive triggering of the thyristor. The capacitor is also used to prevent misoperation of the programmable unijunction transistor caused by the variation in the source voltage while the transistor is maintained OFF.

4 Claims, 5 Drawing Figures

APPARATUS FOR PICKING UP SIGNAL CURRENTS FLOWING THROUGH SIGNAL LINES

BACKGROUND OF THE INVENTION

This invention relates to apparatus for picking up signal currents from a signal line, and more particularly to apparatus of the type wherein a thyristor is turned ON in response to a voltage induced in a pickup coil energized by signal current.

A signal pickup circuit of the type including an annular or closed magnetic core wound with a pickup coil, and a signal line or conductor linking the magnetic core and wherein a voltage pulse induced in the pickup coil when a signal current flows through the signal line is used to render ON a suitable detector such as a thyristor for producing a detection output, is widely used in such applications as a fire alarm system in which a plurality of sensors are arranged in a plurality of groups, and groups of alarming devices, smoke exhaust devices, fire extinguishing devices or operating devices for fire preventing doors are operated in accordance with the signals transmitted from a particular group of the sensors, or these safety devices in a particular block are controlled in accordance with the signal from a particular sensor, or these safety devices are controlled in accordance with the combinations of these control systems. A pickup circuit constructed as shown in FIG. 1 has been used for such applications. In FIG. 1, 7 designates a signal line through which a signal current, for example a signal current produced by a sensor of the type described above, is caused to flow. The signal line 7 links an annular or closed magnetic core 8 wound with a pickup coil 9. One terminal of the pickup coil 9 is connected to the gate electrode G of a thyristor or a silicon controlled rectifier SCR via a diode D and the other terminal is connected to the cathode electrode K of the thyristor. A resistor Rg is connected across the gate and cathode electrodes of the thyristor, while the anode electrode A and the cathode electrode K of the thyristor are connected in a closed circuit including a detection relay 10 and a source of direct current 14. The signal receiver 15 comprising source 14 and relay 10, and the signal transmitter 16 including core 8, pickup coil 9 and thyristor SCR are generally installed spaced apart and are interconnected by conductors 17 and 18. As shown, the receiver 15 is provided with a common input terminal 19 and a plurality of input terminals 19-1 . . . 19-n for respective sensors.

With the circuit construction shown in FIG. 1, when a signal current $i$ flows through the signal line 7, a voltage proportional to the differentiated value of the signal current $i$ is induced in the pickup coil 9 which is applied to the gate electrode G of the thyristor SCR thus triggering the same. Then a closed circuit is established through source 14, relay 10, terminal 19, conductor 17, thyristor SCR, conductor 18 and terminal 19-1 thereby energizing the relay 10. The closure or opening of the contact (not shown) of the relay detects the signal current $i$.

With such circuit construction, however, the magnitude of the voltage induced in the pickup coil 9 is greatly influenced by the magnitude of the input impedance of the load circuit connected to the pickup coil 9. More particularly, when a signal current $i$ having a rectangular waveform as shown in FIG. 3a flows, although momentary, an extremely high voltage pluse would be generated where the load impedance is high, whereas when the load impedance is low, the voltage pulse would be relatively low as shown in FIG. 3b. Accordingly, with circuit construction shown in FIG. 1, as the input impedance across the gate and cathode electrodes G and K of the thyristor SCR is low it is impossible to produce a voltage pulse by the pickup coil 9 which is sufficiently high to trigger the thyristor. To obviate this difficulty, it has been necessary to use a so-called transformer element comprising the magnetic core 8 and the pickup coil 9 and having a large output. However, when a transformer element having large output is used, it will also respond to the noise current that may present on the signal line concurrently with the signal current thus causing misoperations and degrading the S/N ratio.

To solve this problem, although the thyristor SCR may be substituted by a high sensitivity programmable unijunction transistor (PUT) having a high input impedance, such a unijunction transistor is liable to be misoperated by the noise current from the source so that use thereof introduces a new trouble.

SUMMARY OF THE INVENTION

Accordingly, it is an object of this invention to provide a new and improved pickup apparatus for a signal current flowing through a signal line capable of eliminating various problems described above.

Another object of this invention is to provide an improved signal pickup apparatus of the type described above which can operate positively without misoperation caused by noise currents from the source of signal or the source of electric power.

Still another object of this invention is to provide an improved signal pickup apparatus of the type described above and including novel means for passing signal current through the signal line when an emergency sensor operates.

A further object of this invention is to provide an improved display apparatus for an alarming system capable of preventing display of the misoperation of a sensor.

According to this invention, these and other objects can be accomplished by providing apparatus for picking up signal current flowing through a signal line of the type comprising a magnetic core wound with a pickup coil, a signal line linking the magnetic core and a thyristor connected to be turned ON by the voltage induced in the pickup coil, characterized in that means for increasing the load impedance of the pickup coil is connected between the pickup coil and the thyristor thereby positively turning on the same.

According to one embodiment said means for increasing the load impedance of the pickup coil comprises a programmable unijunction transistor, having a high input impedance and a capacitor is connected to the anode electrode of the unijunction transistor for supplying its discharge current to the gate electrode of the thyristor when the unijunction transistor is rendered ON by the induced voltage.

BRIEF DESCRIPTION OF THE DRAWINGS

The invention can be more fully understood from the following detailed description taken in conjunction with the accompanying drawings in which.

DESCRIPTION OF THE PREFERRED EMBODIMENTS

The apparatus of this invention for picking up signal currents flowing through a signal line is constructed to pickup a signal current in the form of a pulse or a step up signal, that is the step up portion of the signal for starting the operation of a relay located at a remote position over signal lines exclusively used for the signalling purpose. More particularly, the apparatus comprises a closed anular magnetic core, a pickup coil wound on the core, a signal line linking the magnetic core, conductors for applying the voltage induced in the pickup coil by the pulse current flowing through the signal line to a programmable unijunction transistor (PUT) having a high input impedance thus triggering the same, a thyristor having a gate electrode connected to the output of the unijunction transistor and a capacitor connected across the unijunction transistor for passing its discharge current through the gate electrode of the thyristor thereby positively triggering the thyristor. The capacitor is connected across a source of supply so as to prevent misoperations of the programmable unijunction transistor caused by the variation in the voltage of the source while the transistor is maintained OFF. The detail of one embodiment of this invention will be described hereunder with reference to FIG. 2.

Figure 1:
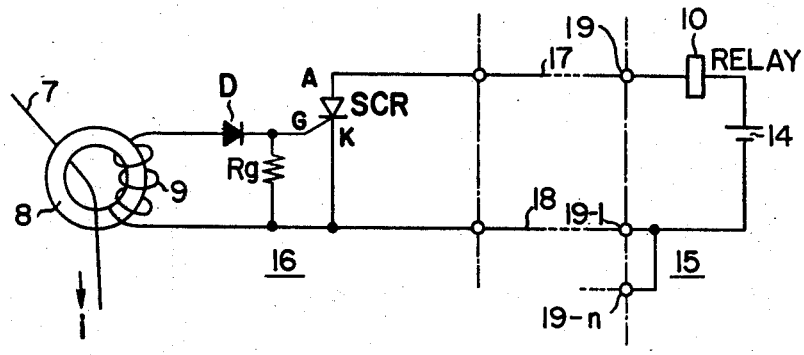
FIG. 1 is a connection diagram showing one example of a prior art apparatus for picking up signal currents flowing through a signal line.
Figure 2:
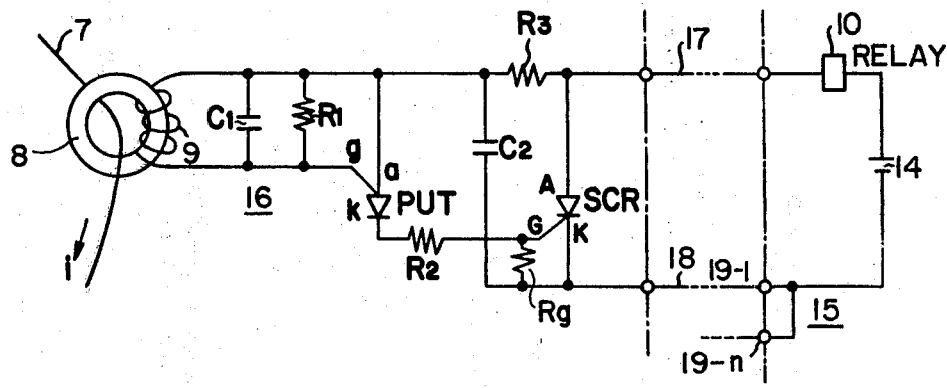
FIG. 2 is a connection diagram of one embodiment of the signal pickup apparatus embodying the invention.
Figure 3:
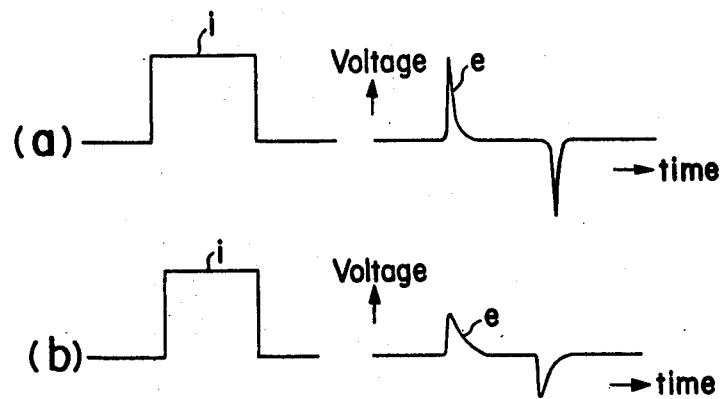
FIG. 3a and 3b show waveforms of the current and voltage of the pickup coil.

Circuit elements shown in FIG. 2 and corresponding to those shown in FIG. 1 are designated by the same reference characters. As shown, the pickup coil 9 is connected across the anode electrode $a$ and the gate electrode $g$ of a programmable unijunction transistor PUT and a capacitor $C_1$ and a resistor $R_1$ are connected in parallel with the pickup coil 9. The cathode electrode $k$ of the unijunction transistor PUT is connected to the gate electrode G of a thyristor SCR via a resistor $R_2$. The anode electrode $a$ of the unijunction transistor PUT is connected to conductor 17 via a resistor $R_3$ and the anode electrode A of the thyristor SCR is connected directly to the conductor 17. A capacitor $C_2$ is connected between the juncture between resistor $R_3$ and the anode electrode $a$ of the unidirectional transistor PUT, and the cathode electrode K of the thyristor SCR, and a resistor Rg is connected between the gate and cathode electrodes G and K of the thyristor.

The pickup apparatus shown in FIG. 2 operates as follows: When a signal current $i$ flows through the signal line 7, a voltage is induced in the pickup coil 9 which is impressed across the anode and gate electrodes $a$ and $g$ of the programmable unijunction transistor PUT thus rendering ON the same. Concurrently with turning ON of the unijunction transistor, a voltage $$V = \frac{R_g}{R_L + R_3 + R_2 + R_g}E$$

which is produced by a potentiometer comprising resistor $R_3$, the reistance $R_L$ of relay 10, and resistor $R_2$ and Rg, is impressed upon the gate electrode G of thyristor SCR. At the same time, the capacitor $C_2$, which has been charged up by the voltage of the source 14 through resistor $R_3$, discharges through a discharge circuit including the anode-cathode circuit of the unijunction transistor PUT, resistor $R_2$ and the gate-cathode circuit of the thyristor SCR, thereby positively triggering the same. Accordingly, the thyristor is turned ON to form a closed circuit including source 14, relay 10, terminal 19, conductor 17, the anode-cathode circuit of the thyristor, conductor 18 and terminal 19-1, thus energizing relay 10. Thus, the contact, not shown, of the relay 10 is closed or opened to detect the signal current.

As described hereinabove, according to this invention, since the pickup coil 9 is connected in parallel with the high impedance input circuit to the programmable unijunction transistor PUT including the anode-cathode circuit thereof it is possible to produce high induced voltage across the pickup coil 9, whereby it is possible to positively trigger the thyristor SCR. Capacitor $C_2$ connected across the conductors 17 and 18 near the unijunction transistor PUT constitutes a filter circuit for the operating source of the unijunction transistor in cooperation with resistor $R_3$ so as to eliminate the noise coming from the source side, thus positively preventing the unijunction transistor from misoperating. The thyristor is less susceptible to the noise coming from the source. As has been pointed out hereinabove, capacitor $C_2$ passes discharge current through the gate electrode of the thyristor as the unijunction transistor PUT is triggered thus ensuring positive triggering of thyristor SCR. Moreover, the capacitor $C_1$ connected across the anode and gate electrodes of the unijunction transistor PUT efficiently eliminates the noise caused by the noise current flowing through the signal line 7. As this capacitor is connected in parallel with the input circuit having a high input impedance its capacity may be small.

Figure 4:
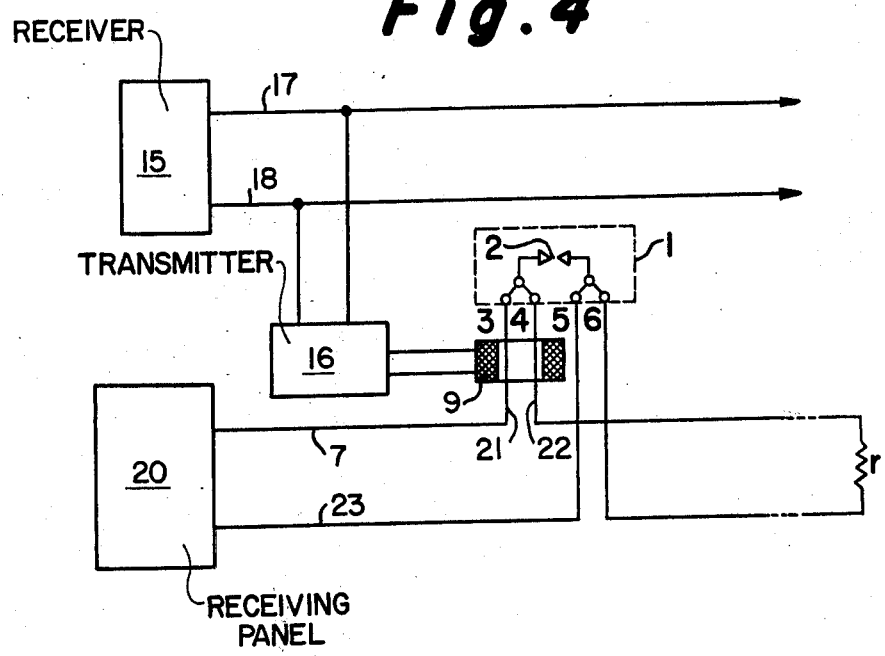
FIG. 4 is a connection diagram showing one mode of generating signal current.

FIG. 4 shows a connection diagram of one example of the mode of generating the signal current wherein a sensor 1 including a contact 2 and provided with four terminals 3, 4, 5 and 6 is associated with a pickup coil 9 of the transmitter 16 which is connected to the receiver 15 through conductors 17 and 18 in a manner described above. Signal line 7 from a receiving panel 20 for displaying the operation of the sensor links the pickup coil 9 through conductors 21 and 22 which form the go and return conductors of a loop, terminals 3 and 4, a terminal resistor $r$, terminals 5 and 6 and conductor 23.

Although a plurality of sensors 1 are connected in parallel, for the sake of simplicity, only one of them is shown. Normally, contact 2 is held open but upon occurrence of an emergency such as a fire hazard, contact 2 is closed to short circuit signal lines 7 and 23. While contact 2 is open, current flows through line 23, terminal resistor $r$, conductors 21 and 22, terminals 3 and 4 and signal line 7. However, as this current flows in the opposite direction through the go and return conductors 21 and 22 of the loop that links the coil 9 no voltage will be induced in the pickup coil 9. When the sensor 1 operates to close its contact 2, current flows from receiving panel 20 through line 23, terminal 5, contact 2, terminal 3 and line 7 so that the operation of the sensor 1 is displayed on receiving panel 20. Under these conditions, however, the currents flowing through conductors 21 and 22 are not equal so that a voltage will be induced in coil 9 which triggers a thyristor in the transmitter 16 via a unijunction transistor in a manner described above. Accordingly, a relay 10 corresponding to sensor 1 is operated to display its operation. Where the relay is substituted by a resistance element having a value specific to the associated sensor and by reading the value of such resistance element through an independent conductor, it is possible to identify an operated sensor in a particular block.

With the connection shown in FIG. 2, wherein the induced voltage caused by the unbalance of the signal current effected by the operation of the sensor is derived out from the pickup coil, a higher detection sensitivity is required than in a case wherein the ON and OFF conditions of the signal current are picked up but according to this invention as it is possible to pick up at higher accuracies the signal current without being affected by noise current so that the novel apparatus is suitable to control various signalling devices without any misoperation.

Figure 5:
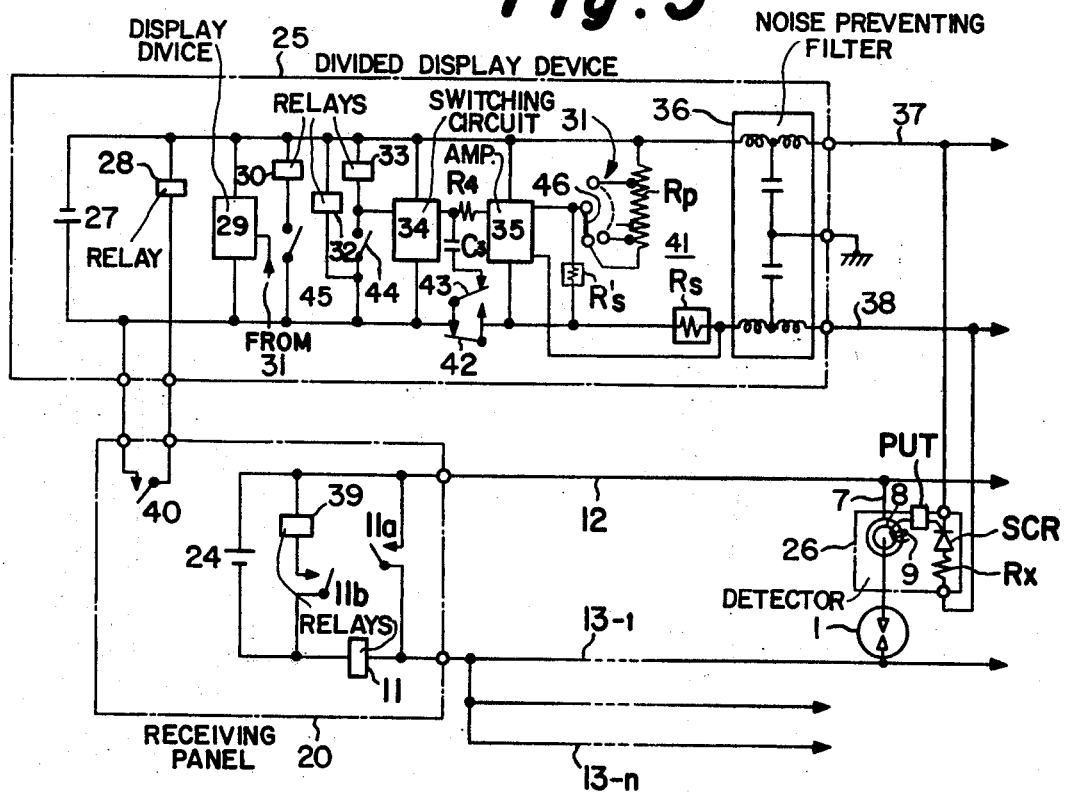
FIG. 5 is a connection diagram of a modified embodiment of this invention.

FIG. 5 shows a connection diagram of a modified embodiment of this invention in which 20 represents a receiving panel of a fire alarm system and includes an alarm relay 11, a source 24, etc. The receiving panel 20 is connected to a sensor 1 provided for the zones or blocks of a building to be supervised through a common line 12 and lines $13_1$ through $13_n$, one for each zone. Although actually there are provided a plurality of sensors 1, only one of them is shown in FIG. 5. Each sensor 1 is provided with a manually or automatically closed contact for short circuiting lines 12 and $13_1$, like the embodiment shown in FIG. 4. The construction described above is well known and when sensors 1 closes its contact in response to the occurrence of a fire hazard, relay 11 is operated to energize an alarming device, not shown. Once operated, relay 11 is maintained in the operated condition by the closure of its self-holding contact 11a.

To discriminate which one of the sensors 1 is operated, there is provided a divided display device 25, and the sensor 1 is provided with a detector 26. The divided display device 25 comprises a source 27, an auxiliary relay 28, a display device 29, a relay 30 for driving a stepping switch 31, relays 32 and 33, a switching circuit 34, an amplifier 35, a tapped resistor or a potentiometer resistor $R_p$, a constant current element $R_s$, $R_s'$, a noise preventing filter 36, and a plurality of signal conductors 37 and 38. Amplifier 35 comprises an amplifier made up of an integrated circuit and the switching circuit 34 comprises a transistor switching circuit.

The detector 26 comprises a magnetic core 8 linked by a signal line conductor 7 which interconnects lines 12 and 13-1, a pickup coil 9 wound on the magnetic core, a thyristor SCR with its gate electrode connected to one terminal of the pickup coil 9 and a resistor $R_x$ having a value specific to respective sensor 1. A programmable unijunction transistor identical to that shown in FIG. 2 is connected in series with the gate electrode of the thyristor for the purpose of increasing the load impedance of the pickup coil 9. Receiving panel 20 is provided with an auxiliary relay 39 for operating the divided display device 25, the relay 39 having contact 40.

The embodiment shown in FIG. 5 operates as follows: In response to the occurrence of a fire hazard or other emergency condition, the contact of sensor 1 is closed manually or automatically. Then current flows through lines 12 and 13-1, signal line 7 and relay 11 to operate the same. This current induces a voltage across the pick up coil 9 which turns ON thyristor SCR through transistor PUT, thus inserting resistor $R_x$ across conductors 37 and 38. Resistor $R_x$ comprises a balanceable auxiliary circuit 41 together with a constant current elements $R_s$ and $R_s'$ comprised by a high resistance element, for example, and a tapped resistor $R_p$. When resistor $R_x$ is connected between signal conductors 37 and 38 current flows from source 27 through a circuit including contact 42 of a relay 33, constant current elements $R_s$, filter 36, conductor 38, resistor $R_x$, thyristor SCR, conductor 37 and filter 36, thus creating a voltage drop across constant current element $R_s$. In response to this voltage drop, amplifier 35 produces an output which is applied to the switching circuit 34 via a delay circuit comprising a resistor $R_4$ and a capacitor $C_3$. Accordingly, the switching circuit 34 operates a predetermined time later to energize relay 33.

As described above, when the sensor 1 operates alarm relay 11 in the receiving panel 20 operates to close its contact 11b thus energizing relay 39. Relay 39 energizes relay 28 in the divided display device through its contact 40. When energized, relay 28 operates its contact 43 and 44. When contact 43 is operated downwardly, capacity $C_3$ in the delay circuit is interrupted so that amplifier 35 and the switching circuit 34 are interconnected only by resistor $R_4$, thus eliminating the delay. Further, contact 42 will be shunted by contact 43. Closure of contact 44 connects relays 33 and 32 across source 27 whereby contact 45 of relay 32 is closed. Consequently, relay 30 for operating the stepping switch 31 is energized to move its arm 46 stepwisely. When a relationship $R_{pa} \cdot R_s = R_s' \cdot R_x$ is established, where $R_{pa}$ represents the resistance of the tapped resistor $R_p$ between the movable arm 46 and the negative terminal of source 27, $R_s'$ the resistance of element $R_s'$ and $R_x$ the resistance of resistor $R_x$, the balanceable auxiliary circuit 41 is balanced so that the arm of the stepping switch 31 is stopped to this position. When a balance is reached, the output from amplifier 35 disappears and the switching device 34 is deenergized thus stopping the stepping of the stepping switch 31. Thus, in accordance with the position at which the stepping switch has stopped the display device 29 displays the operated sensor 1.

In spite of the fact that the sensor 1 is not operated, when the thyristor SCR is rendered ON by a noise to connect resistor $R_x$ across conductors 37 and 38, thus producing an output from amplifier 35, this output turns ON the switching circuit 34 after a predetermined time determined by the delay circuit. Accordingly, relay 33 is energized to open its contact 42. Opening of contact 42 interrupts signal conductor 38 whereby thyristor SCR is turned OFF. Since sensor 1 is not operated relays 39 and 28 are not energized so that contacts 43 and 44 are maintained in the positions shown in FIG. 5. As the contact 44 is opened, relay 32 and hence relay 30 are not energized so that the stepping switch 31 is not energized. As the thyristor SCR is rendered OFF as described hereinabove, amplifier 35 is deenergized to deenergize relay 33 to reclose contact 42, thus restoring the system to the waiting condition.

As contacts 43 and 44 are mechanical contacts which are operated relatively slowly, the delay circuit ($R_4$ and $C_3$) is provided for the purpose of preventing the operation of relay 33 before these contacts 43 and 44 are operated. These contacts are also provided for the purpose of preventing identification and display operations of the sensor 1 as long as it is not operated. By this construction, it is possible to correctly identify and display a particular sensor among a plurality of sensors.

Although the invention has been shown and described in terms of certain preferred embodiments thereof it will be clear that many changes and modifications will be obvious to one skilled in the art without departing from the true spirit and scope of the invention as defined in the appended claims.

What is claimed is:

1. An apparatus for discriminating an operated sensor and attached to an alarm system in which a plurality of sensors are connected in parallel between signal lines led from a receiving panel of said alarm system for short-circuiting said signal lines so that a signal current passes through said signal lines when said sensor has detected an abnormal condition, said apparatus comprising an annular magnetic core wound with a pickup coil linked with one of said signal lines for picking up said signal current flowing through said signal lines, thyristor means connected to be turned ON by the voltage induced in said pickup coil, a programmable unijunction transistor connected to said pickup coil and said thyristor for increasing the load impedance of said pickup coil thereby positively turning ON said thyristor, the output of said pickup coil being connected to the gate input of said programmable unijunction transistor, the output of said programmable unijunction transistor being connected to the gate input of said thyristor means, a capacitor connected to be charged from a source of direct current, a discharge circuit connected to said capacitor for discharging said capacitor, said discharge circuit comprising the anode-cathode circuit path of said transistor and the gate-cathode circuit path of said thyristor connected to said anode-cathode circuit path, and to discharge through a discharge circuit including the anode-cathode circuit of said transistor and the gate-cathode circuit of said thyristor, said signal lines having signal and return conductors connected to said sensor, said conductors forming a loop, one of said conductors being magnetically coupled with said magnetic core corresponding to each of the sensors whereby when said respective sensor is operated, the currents flowing through the signal and return conductors being unequal and thereby inducing a voltage across said pickup coil.

2. The apparatus according to claim 1, including another capacitor connected across the anode and gate electrodes of said programmable unijunction transistor.

3. The apparatus according to claim 1, wherein said loop is connected across said receiving panel through said signal lines, a resistor for terminating said signal lines whereby when said sensor is unoperated, the same current flows through the signal and return conductors of said loope so that no voltage is induced in said pickup coil.

4. The apparatus according to claim 1, including a respective resistor for each sensor and having a value specific to the respective sensor and connected in series with said thyristor across a pair of signal conductors, a balanceable auxiliary circuit with circuit arms operative when said thyristor is ON and including said resistor as one of its arms, switching means operated by the output of said auxiliary circuit through a delay circuit, a reset relay responsive to the operation of said switching means for turning OFF said thyristor thereby disconnecting said resistor from said signal conductors, a potentiometer resistor, stepping relay means operated when said switching means is operated and when said sensor is operated for varying the resistance of said potentiometer by said relay means to balance said auxiliary circuit so as to read the value of said resistor, and display means connected to the arm of said potentiometer so that when the arm of said potentiometer moves by the operation of said relay means and stops at a position corresponding to the instant that said auxiliary circuit is balanced, said display means indicating the stopped position of said potentiometer arm and thereby the operation of said sensor.

\* \* \* \* \*